(12) United States Patent
Huang et al.

(10) Patent No.: US 12,238,951 B2
(45) Date of Patent: Feb. 25, 2025

(54) ORGANIC ELECTROLUMINESCENT DEVICE AND ARRAY SUBSTRATE

(71) Applicant: BOE TECHNOLOGY GROUP CO., LTD., Beijing (CN)

(72) Inventors: Qingyu Huang, Beijing (CN); Fudong Chen, Beijing (CN); Zhiqiang Jiao, Beijing (CN); Guangcai Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 405 days.

(21) Appl. No.: 17/629,389

(22) PCT Filed: Apr. 9, 2021

(86) PCT No.: PCT/CN2021/086284
§ 371 (c)(1),
(2) Date: Jan. 23, 2022

(87) PCT Pub. No.: WO2021/238448
PCT Pub. Date: Dec. 2, 2021

(65) Prior Publication Data
US 2022/0278293 A1    Sep. 1, 2022

(30) Foreign Application Priority Data

May 25, 2020 (CN) .......................... 202010449363.9

(51) Int. Cl.
*H01L 51/50* (2006.01)
*H01L 27/32* (2006.01)
(Continued)

(52) U.S. Cl.
CPC ........... *H10K 50/155* (2023.02); *H10K 50/12* (2023.02); *H10K 50/13* (2023.02); *H10K 50/165* (2023.02); *H10K 59/32* (2023.02)

(58) Field of Classification Search
CPC .... H10K 50/11; H10K 50/155; H10K 50/165; H10K 50/13; H10K 50/12; H10K 50/125;
(Continued)

(56) References Cited

U.S. PATENT DOCUMENTS

| 8,460,950 B2 | 6/2013 | Ono et al. |
| 2006/0125380 A1* | 6/2006 | Nagara ................... H10K 50/11 313/506 |

(Continued)

FOREIGN PATENT DOCUMENTS

| CN | 1790768 A | 6/2006 |
| CN | 102024909 A | 4/2011 |

(Continued)

OTHER PUBLICATIONS

International Search Report and Written Opinion for International Application No. PCT/CN2021/086284 mailed Jun. 30, 2021.
(Continued)

*Primary Examiner* — Shahed Ahmed
*Assistant Examiner* — Rhys Poniente Sheker
(74) *Attorney, Agent, or Firm* — Perilla Knox & Hildebrandt LLP; Kenneth A. Knox

(57) ABSTRACT

An organic electroluminescent device comprises an anode, a first organic light emitting layer, an exciton control layer, a second organic light emitting layer, and a cathode that are successively stacked, wherein the first organic light emitting layer comprises a hole transport type host material and a first doped material; the exciton control layer is provided on the surface of the first organic light emitting layer away from the anode; the exciton control layer comprises a first hole transport material and a first electron transport material; the second organic light emitting layer comprises an electron transport type host material and a second doped material; the cathode is provided on the side of the second organic light
(Continued)

emitting layer away from the anode; and one of the first doped material and the second doped material is a fluorescence-doped material, and the other is a phosphorescence-doped material.

20 Claims, 5 Drawing Sheets

(51) Int. Cl.
  *H10K 50/12* (2023.01)
  *H10K 50/13* (2023.01)
  *H10K 50/155* (2023.01)
  *H10K 50/165* (2023.01)
  *H10K 59/32* (2023.01)

(58) Field of Classification Search
  CPC .... H10K 50/16; H10K 50/15; H10K 2101/10; H10K 2101/27; H10K 59/32; H10K 50/00–88; H10K 59/00–95; H10K 71/00–861
  See application file for complete search history.

(56) References Cited

U.S. PATENT DOCUMENTS

| | | | |
|---|---|---|---|
| 2008/0284318 A1* | 11/2008 | Deaton | H10K 50/131 313/504 |
| 2010/0244002 A1 | 9/2010 | Ono et al. | |
| 2014/0319492 A1* | 10/2014 | Seo | H10K 85/6572 257/40 |

FOREIGN PATENT DOCUMENTS

| | | |
|---|---|---|
| CN | 102751449 A | 10/2012 |
| CN | 102884649 A | 1/2013 |
| CN | 102751449 B | 4/2015 |
| CN | 105206754 A | 12/2015 |
| CN | 105449108 A | 3/2016 |
| CN | 105449108 B | 7/2017 |
| CN | 110190200 A | 8/2019 |
| CN | 110190200 B | 7/2020 |
| CN | 111564566 A | 8/2020 |

OTHER PUBLICATIONS

First Office Action for CN Patent Application No. 202010449363.9 mailed Dec. 28, 2021.

Second Office Action for CN Patent Application No. 202010449363.9 mailed Jun. 24, 2022.

Sun, Yiru & Giebink, Noel & Kanno, Hiroshi & Ma, Biwu & Thompson, Mark & Forrest, Stephen. (2006). Management of Singlet and Triplet Excitons for Efficient White Organic Light-Emitting Devices. Nature. 440. 908-12. 10.1038/nature04645.

* cited by examiner

ORGANIC ELECTROLUMINESCENT DEVICE AND ARRAY SUBSTRATE

CROSS-REFERENCE TO RELATED APPLICATIONS

The present application is based upon and is a national phase application under 35 U.S.C. § 371 of International Application No. PCT/CN2021/086284, filed on Apr. 9, 2021, which claims the benefit of and priority to Chinese Patent Application No. 202010449363.9, entitled "ORGANIC ELECTROLUMINESCENT DEVICE AND ARRAY SUBSTRATE", filed on May 25, 2020, the entire contents of which are hereby incorporated by reference.

TECHNICAL FIELD

The present disclosure relates to the field of display technologies and, in particular, to an organic electroluminescent device and an array substrate.

BACKGROUND

Single-stack (1-stack) white organic light emitting diodes (WOLEDs) have less structural layers and a short mass production takt time, and is widely required in the field of low-brightness display panel or the like. In the prior art, red, green, and blue light emitting materials are doped into the same light emitting host material in the 1-stack WOLEDs to achieve simultaneous emission of three colors of red, green, and blue light.

It should be noted that the information disclosed in the Background section above is only for enhancing the understanding of the background of the present disclosure, and thus may include information that does not constitute prior art known to those of ordinary skill in the art.

BRIEF SUMMARY

An organic electroluminescent device and an array substrate are described.

According to a first aspect of the present disclosure, there is provided an organic electroluminescent device, including:
an anode;
a first organic light emitting layer disposed on a side of the anode and including a hole transport type host material and a first doping material;
an exciton control layer disposed on a surface of the first organic light emitting layer away from the anode, and including a first hole transport material and a first electron transport material;
a second organic light emitting layer disposed on a surface of the exciton control layer away from the anode, and including an electron transport type host material and a second doping material; and
a cathode disposed on a side of the second organic light emitting layer away from the anode;
wherein one of the first doping material and the second doping material is a fluorescent doping material, and the other is a phosphorescent doping material.

In an exemplary embodiment of the present disclosure, the exciton control layer is composed of the first hole transport material and the first electron transport material.

In an exemplary embodiment of the present disclosure, a thickness of the exciton control layer is 2-20 nm.

In an exemplary embodiment of the present disclosure, the organic electroluminescent device further includes:

a hole transport layer disposed between the first organic light emitting layer and the anode; wherein the hole transport layer includes the first hole transport material.

In an exemplary embodiment of the present disclosure, the organic electroluminescent device further includes:
an electron transport layer disposed between the second organic light emitting layer and the cathode; wherein the electron transport layer includes the first electron transport material.

In an exemplary embodiment of the present disclosure, the first doping material is the fluorescent doping material, and a mass proportion of the first hole transport material in the exciton control layer is 0.1%-50%;
or, the second doping material is the fluorescent doping material, and a mass proportion of the first electron transport material in the exciton control layer is 0.1%-50%.

In an exemplary embodiment of the present disclosure, the first doping material is the fluorescent doping material, and a mass proportion of the first hole transport material in the exciton control layer is 0.3%-10%;
or, the second doping material is the fluorescent doping material, and a mass proportion of the first electron transport material in the exciton control layer is 0.3%-10%.

In an exemplary embodiment of the present disclosure, the second doping material is the fluorescent doping material, and the first hole transport material is 4,4',4"-tris(N-3-methylPhenyl-N-phenylamino) triphenylamine; the first electron transport material is tris[2,4,6-trimethyl-3-(3-pyridyl)phenyl]borane; and the mass proportion of the first hole transport material in the exciton control layer is 5%.

In an exemplary embodiment of the present disclosure, the phosphorescent doping material is a yellow phosphorescent doping material.

In an exemplary embodiment of the present disclosure, the phosphorescent doping material includes a red phosphorescent doping material and a green phosphorescent doping material mixed with each other.

In an exemplary embodiment of the present disclosure, the first doping material includes the red phosphorescent doping material and the green phosphorescent doping material, and the hole transport type host material includes a first hole transport type host material and a second hole transport type host material; and
the first organic light emitting layer includes a first green organic light emitting layer and a first red organic light emitting layer that are stacked; the first green organic light emitting layer includes the first hole transport type host material and the green phosphorescent doping material, and the first red organic light emitting layer includes the second hole transport type host material and the red phosphorescent doping material.

In an exemplary embodiment of the present disclosure, the first green organic light emitting layer is disposed on a surface of the exciton control layer away from the second organic light emitting layer; the first red organic light emitting layer is disposed on a surface of the first green organic light emitting layer away from the second organic light emitting layer.

In an exemplary embodiment of the present disclosure, the second doping material includes the red phosphorescent doping material and the green phosphorescent doping material, and the electron transport type host material includes a first electron transport type host material and a second electron transport type main material; and the second organic light emitting layer includes a second green organic light emitting layer and a second red organic light emitting layer that are stacked; the second green organic light emitting layer includes the first electron transport type host material and the green phosphorescent doping material, and the second red organic light emitting layer includes the second electron transport type host material and the red phosphorescent doping material.

In an exemplary embodiment of the present disclosure, the second green organic light emitting layer is disposed on a surface of the exciton control layer away from the first organic light emitting layer, and the second red organic light emitting layer is disposed on a surface of the second green organic light emitting layer away from the first organic light emitting layer.

According to a second aspect of the present disclosure, there is provided an array substrate including the above-mentioned organic electroluminescent device.

BRIEF DESCRIPTION OF THE DRAWINGS

The above-mentioned and other features and advantages of the present disclosure will become more apparent by describing exemplary embodiments thereof in detail with reference to the accompanying drawings.

DETAILED DESCRIPTION

Figure 1:
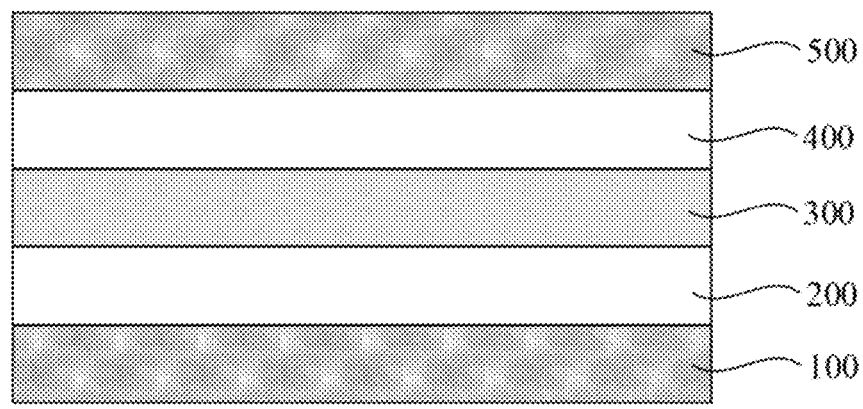
FIG. 1 is a schematic structural diagram of an organic electroluminescent device according to an embodiment of the present disclosure.

Exemplary embodiments will now be described more fully with reference to the accompanying drawings. However, the exemplary embodiments can be implemented in a variety of forms and should not be construed as being limited to the examples set forth herein; rather, these embodiments are provided so that the present disclosure will be more full and complete so as to convey the idea of the exemplary embodiments to those skilled in this art. The described features, structures, or characteristics may be combined in any suitable manner in one or more embodiments. In the following description, many specific details are provided to give a full understanding of the embodiments of the present disclosure.

In the figure, thicknesses of regions and layers may be exaggerated for clarity. The same reference numerals in the drawings denote the same or similar parts, and the repeated description thereof will be omitted.

The features, structures, or characteristics described above may be combined in any suitable manner in one or more embodiments. In the following description, numerous specific details are set forth to provide a thorough understanding of the embodiments of the present disclosure. However, those skilled in the art will appreciate that the technical solution of the present disclosure may be practiced without one or more of the specific details, or other methods, components, materials, and the like may be employed. In other instances, well-known structures, materials, or operations are not shown or described in detail to avoid obscuring the main technical idea of the present disclosure.

When a structure is "on" another structure, it may mean that a structure is integrally formed on another structure, or that a structure is "directly" disposed on another structure, or that a structure is "indirectly" disposed on another structure through other structures.

The terms "one", "a", "the", and "said" are used to indicate the existence of one or more elements/components or the like; the terms "include" and "have" are used to indicate an open meaning of including and means that there may be additional elements/components/etc. in addition to the listed elements/components/etc. The terms "first", "second", etc. are used only as markers or labels, and do not limit the number of objects.

The present disclosure provides an organic electroluminescent device. As shown in FIG. 1, the organic electroluminescent device includes an anode 100, a first organic light emitting layer 200, an exciton control layer 300, a second organic light emitting layer 400, and a cathode 500 that are sequentially stacked. The first organic light emitting layer 200 is disposed on a side of the anode 100, and includes a hole transport type host material and a first doping material. The exciton control layer 300 is disposed on a surface of the first organic light emitting layer 200 away from the anode 100, and includes a first hole transport material and a first electron transport material. The second organic light emitting layer 400 is disposed on a surface of the exciton control layer 300 away from the anode 10, and includes an electron transport type host material and a second doping material. The cathode 500 is disposed on a side of the second organic light emitting layer 400 away from the anode 100. One of the first doping material and the second doping material is a fluorescent doping material, and the other is a phosphorescent doping material.

Figure 2:
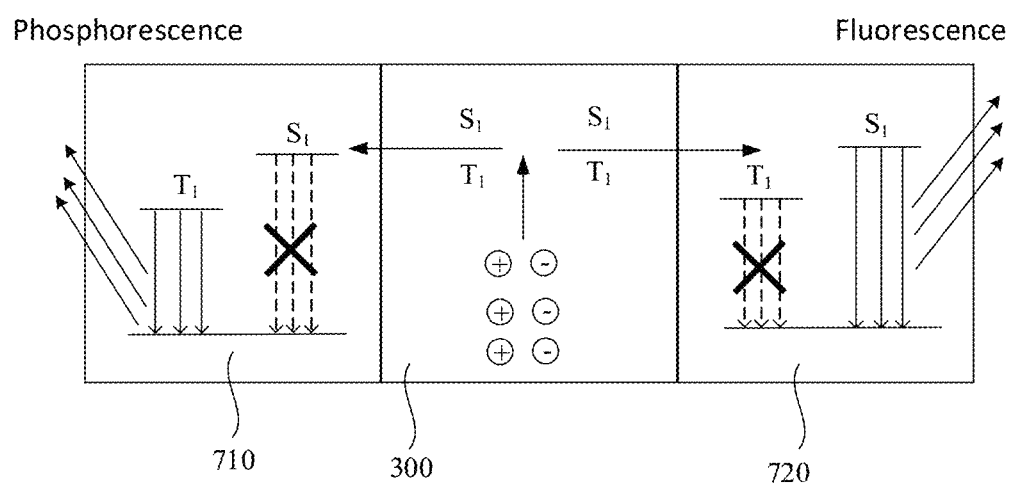
FIG. 2 is a schematic diagram of a light emitting principle of an organic electroluminescent device according to an embodiment of the present disclosure.

The organic electroluminescent device provided by the present disclosure includes the first organic light emitting layer 200, the exciton control layer 300 and the second organic light emitting layer 400 that are sequentially stacked. Carrier transport types of host materials in the first organic light emitting layer 200 and the second organic light emitting layer 400 are different. During operation, as shown in FIG. 2, holes and electrons can recombine in the exciton control layer 300 to generate excitons. Singlet excitons Si diffuse into an organic light emitting layer 720 containing the fluorescent doping material, so that the corresponding organic light emitting layer emits fluorescence; and triplet excitons T1 diffuse into an organic light emitting layer 710 containing the phosphorescent doping material, so that the corresponding organic light emitting layer emits phosphorescence. In this way, the exciton control layer 300 can serve as a hole-electron recombination center of the organic electroluminescent device of the present disclosure, and the excitons generated by this recombination center can cause the two different organic light emitting layers on both sides to emit the fluorescence and the phosphorescence, respectively. The organic electroluminescent device enables the first organic light emitting layer 200 and the second organic light emitting layer 400 to select suitable host materials according to their respective doping materials, avoiding the fluorescent doping material and the phosphorescent doping material from being doped in the same host material. In turn, the light emitting efficiency of the organic light emitting layer 720 containing the fluorescent doping material can be improved, and a proportion of the fluorescence emitted by the fluorescent doping material in the emitted light of the organic electroluminescent device can be increased, so that proportions of light of respective colors in the emitted light are more balanced and the light emitting performance of the organic electroluminescent device is improved Hereinafter, a structure, distance, and effect of the organic electroluminescent device provided by the present disclosure will be further explained and described in conjunction with the accompanying drawings.

The organic electroluminescent device provided by the present disclosure is a single-stack autonomous light emitting device, and its emitted light is a mixture of the light emitted by the first organic light emitting layer 200 and the light emitted by the second organic light emitting layer 400, that is, it is a mixture of the phosphorescence emitted by the organic light emitting layer 710 containing the phosphorescent doping material and the fluorescence emitted by the organic light emitting layer 720 containing the fluorescent doping material. The mixed light may be a kind of colored light, for example, it may be reddish light, greenish light, blue light, or other colored light, or may also be white light. In an embodiment of the present disclosure, the organic electroluminescent device provided by the present disclosure may be a white light organic electroluminescent device, and the white light organic electroluminescent device can have the light emitted by the first organic light emitting layer 200 and the light emitted by the second organic light emitting layer 400 mixed, thereby presenting the effect of emitting the white light. The organic electroluminescent device can be used in a lighting device or used as a white sub-pixel of a display panel, or can be used as a light source device in a color film-white OLED (CF-WOLED), which is not particularly limited by the present disclosure.

The organic electroluminescent device provided by the present disclosure includes the cathode 500 and the anode 100 that are disposed oppositely. A material of the anode 100 can be selected from conductive materials with a large work function to facilitate the injection of holes into an organic layer between the cathode 500 and the anode 100. In some embodiments, the material of the anode 100 may be selected from metals or alloys, for example, it may be selected from nickel, platinum, vanadium, chromium, copper, zinc and gold or their alloys; it may also be selected from metal oxides, for example, it may be selected from zinc oxide, indium oxide, indium tin oxide (ITO), indium zinc oxide (IZO), etc.; it can also be selected from a combination of metal oxides and metals, for example, can be selected from $ZnO:Al$ or $SnO_2:Sb$, etc.; it can also be selected from conductive polymers, for example, selected from poly(3-methylthiophene), poly[3,4-(ethylene-1,2-dioxy)thiophene] (PEDT), polypyrrole, polyaniline, and the like. A material of the cathode 500 may be selected from materials having a small work function to facilitate the injection of electrons into the organic layer between the cathode 500 and the anode 100. In some embodiments, the material of the cathode 500 may be selected from metals or alloys, for example, selected from magnesium, calcium, sodium, potassium, titanium, indium, yttrium, lithium, gadolinium, aluminum, silver, tin, and lead, or their alloys. The present disclosure does not specifically limit the materials of the cathode 500 and the anode 100.

It can be understood that at least one of the cathode 500 and the anode 100 is a transparent electrode to ensure that the organic electroluminescent device emits the light outward.

Figure 3:
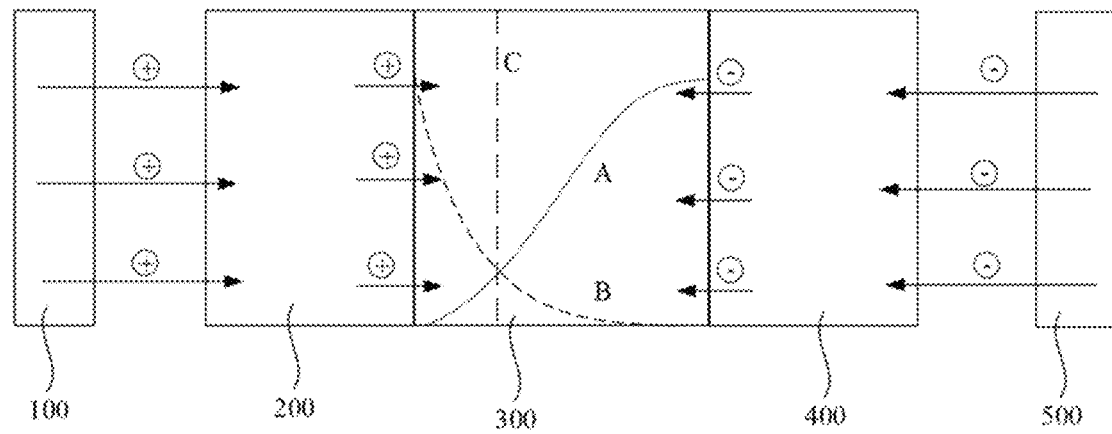
FIG. 3 is a schematic diagram of electron-hole recombination positions according to an embodiment of the present disclosure.
Figure 4:
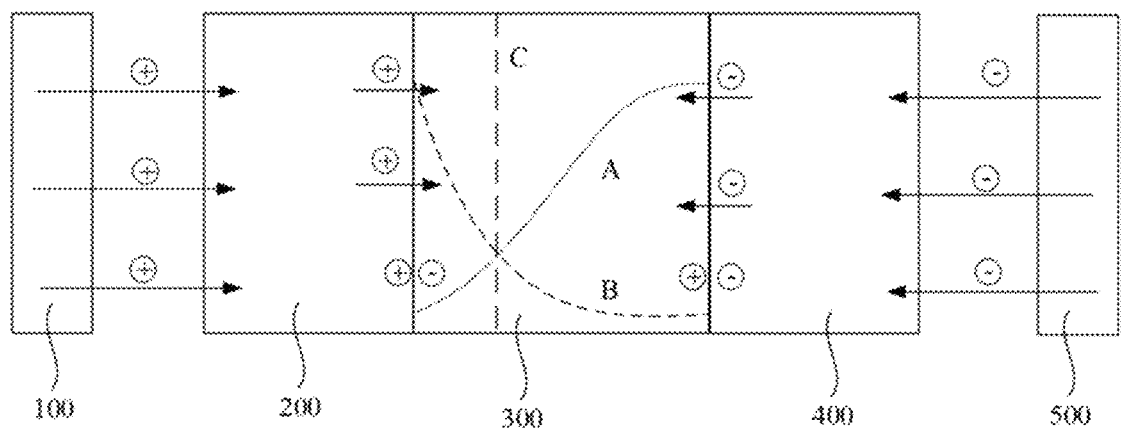
FIG. 4 is a schematic diagram of electron-hole recombination positions according to an embodiment of the present disclosure.
Figure 5:
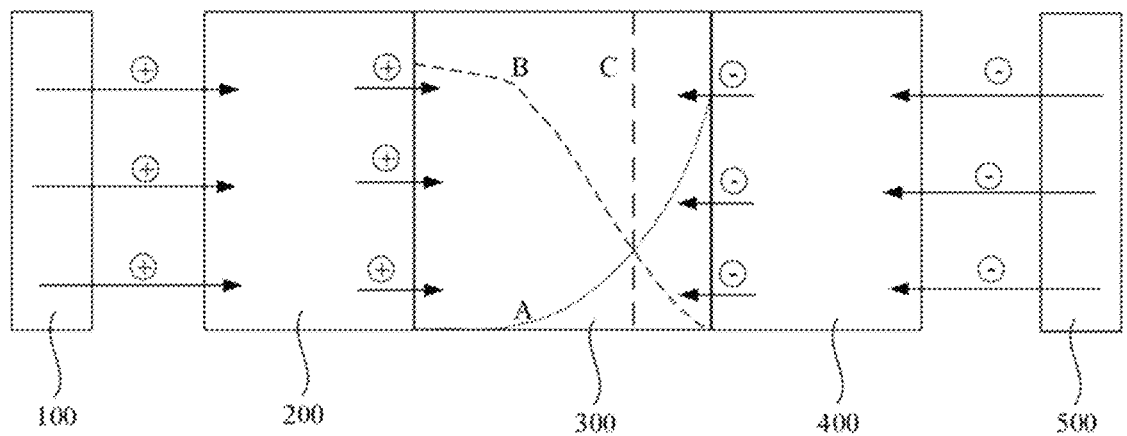
FIG. 5 is a schematic diagram of electron-hole recombination positions according to an embodiment of the present disclosure.

In the organic electroluminescent device provided by the present disclosure, one of the first doping material and the second doping material is the fluorescent doping material, and the other is the phosphorescent doping material, thus, one of the first organic light emitting layer 200 and the second organic light emitting layer 400 is the organic light emitting layer 710 containing the phosphorescent doping material, and the other is the organic light emitting layer 720 containing the fluorescent doping material. The exciton control layer 300 is sandwiched between the first organic light emitting layer 200 and the second organic light emitting layer 400, that is, the exciton control layer 300 is sandwiched between the organic light emitting layer 710 containing the phosphorescent doping material and the organic light emitting layer 720 containing the fluorescent doping material. In an operating state, as shown in FIGS. 3 to 5, the first organic light emitting layer 200 can transport the holes and inject the holes into the exciton control layer 300, the second organic light emitting layer 400 can transport the electrons and inject the electrons into the exciton control layer 300, and the electrons and the holes can recombine in the exciton control layer 300 to generate the singlet excitons and the triplet excitons. After the singlet excitons diffuse from the exciton control layer 300 to the organic light emitting layer 720 containing the fluorescent doping material, the fluorescent doping material can emit the fluorescence, and after the triplet excitons diffuse from the exciton control layer 300 to the organic light emitting layer 710 containing the phosphorescent doping material, the phosphorescent doping material can emit the phosphorescence.

In some embodiments, a thickness of the exciton control layer 300 can be 2-20 nanometers, to avoid the thickness of the exciton control layer 300 being too thin to control exciton generation positions, and to avoid the exciton control layer 300 being too thin and prone to an uneven thickness, and also avoid the thickness of the exciton control layer 300 being too thick to be conductive to the diffusion of the excitons. In other embodiments, the thickness of the exciton control layer 300 may be 3-10 nanometers.

In some embodiments, the exciton control layer 300 is composed of the first hole transport material and the first electron transport material. In this way, a material formula of the exciton control layer 300 can be simplified to facilitate the preparation of the exciton control layer 300, and it is also convenient to adjust the electron-hole recombination positions by adjusting a proportion of the first hole transport material and the first electron transport material in the exciton control layer 300, which in turn adjusts the light emitting brightness of the first organic light emitting layer 200 and the second organic light emitting layer 400, so as to improve the balance of different light in the emitted light of the organic electroluminescent device.

In some embodiments, the first doping material is the fluorescent doping material, the second doping material is the phosphorescent doping material, and a mass proportion of the first hole transport material in the exciton control layer 300 is 0.1%-50%. In other embodiments, the mass proportion of the first hole transport material in the exciton control layer 300 is 0.3%-10%. In these embodiments, the first organic light emitting layer 200 includes the hole transport type host material and the fluorescent doping material, and the second organic light emitting layer 400 includes the electron transport type host material and the phosphorescent doping material.

FIG. 3 shows a schematic diagram of a center of electron-hole recombination positions in the exciton control layer 300 in these embodiments, where a dashed line A represents a concentration distribution of the electrons, a dashed line B represents a concentration distribution of the holes, and a dashed line C represents the center of electron-hole recombination positions. Referring to FIG. 3, the holes are injected from the first organic light emitting layer 200 to the exciton control layer 300 and continue to be transported toward the second organic light emitting layer 400, and recombine with the electrons during the transport process; therefore, referring to the dashed line B in FIG. 3, a concentration of the holes in the exciton control layer 300 gradually decreases in a direction from the first organic light emitting layer 200 to the second organic light emitting layer 400. The electrons are injected from the second organic light emitting layer 400 to the exciton control layer 300 and continue to be transported toward the first organic light emitting layer 200, and recombine with the holes during the transport process; therefore, referring to the dashed line A in FIG. 3, a concentration of the electrons in the exciton control layer 300 gradually decreases in a direction from the second organic light emitting layer 400 to the first organic light emitting layer 200. Since the first hole transport material in the exciton control layer 300 is less than the first electron transport material in the exciton control layer 300, a migration rate of the holes in the exciton control layer 300 is less than a migration rate of the electrons in the exciton control layer 300, which makes the center of the electron-hole recombination positions closer to the first organic light emitting layer 200, as shown in FIG. 3. In other words, in the exciton control layer 300, a concentration of partial excitons close to the first organic light emitting layer 200 is greater than a concentration of partial excitons close to the second organic light emitting layer 400. Since a diffusion distance of the singlet excitons is much shorter than that of the triplet excitons, and the concentration of the singlet excitons is less than that of the triplet excitons, this embodiment can ensure the concentration of the singlet excitons that can diffuse to the first organic light emitting layer 200, thereby ensuring the intensity of the fluorescence emitted by the first organic light emitting layer 200; moreover, this embodiment can further balance the amount of the singlet excitons transported to the first organic light emitting layer 200 and the amount of the triplet excitons transported to the second organic light emitting layer 400, thereby balancing the intensity of the fluorescence emitted by the first organic light emitting layer 200 and the intensity of the phosphorescence emitted by the second organic light emitting layer 400. In particular, when the organic electroluminescent device is a white light device, this embodiment can balance the proportion of light of different colors in the emitted light, thereby achieving a better white light balance.

In other embodiments, the first doping material is the phosphorescent doping material, the second doping material is the fluorescent doping material, and the mass proportion of the first electron transport material in the exciton control layer 300 is 0.1%-50%. In particular, the mass proportion of the first electron transport material in the exciton control layer 300 is 0.3%-10%. In these embodiments, the first organic light emitting layer 200 includes the hole transport type host material and the phosphorescent doping material, and the second organic light emitting layer 400 includes the electron transport type host material and the fluorescent doping material.

FIG. 5 shows a schematic diagram of a center of electron-hole recombination positions in the exciton control layer 300 in these embodiments, where a dashed line A represents a concentration distribution of the electrons, a dashed line B represents a concentration distribution of the holes, and a dashed line C represents the center of electron-hole recombination positions. Referring to FIG. 5, the holes are injected from the first organic light emitting layer 200 to the exciton control layer 300 and continue to be transported toward the second organic light emitting layer 400, and recombine with the electrons during the transport process; therefore, referring to the dashed line B in FIG. 5, a concentration of the holes in the exciton control layer 300 gradually decreases in a direction from the first organic light emitting layer 200 to the second organic light emitting layer 400. The electrons are injected from the second organic light emitting layer 400 to the exciton control layer 300 and continue to be transported toward the first organic light emitting layer 200, and recombine with the holes during the transport process; therefore, referring to the dashed line A in FIG. 5, a concentration of the electrons in the exciton control layer 300 gradually decreases in a direction from the second organic light emitting layer 400 to the first organic light emitting layer 200. Since the first hole transport material in the exciton control layer 300 is more than the first electron transport material in the exciton control layer 300, the migration rate of the electrons in the exciton control layer 300 is less than the migration rate of the holes in the exciton control layer 300, which makes the center of the electron-hole recombination positions closer to the second organic light emitting layer 400. In other words, in the exciton control layer 300, the concentration of partial excitons close to the second organic light emitting layer 400 is greater than the concentration of partial excitons close to the first organic light emitting layer 200. Since the diffusion distance of the singlet excitons is much shorter than that of the triplet excitons, and the concentration of the singlet excitons is less than that of the triplet excitons, this embodiment can ensure the singlet excitons can diffuse to the second organic light emitting layer 400 more easily, thereby ensuring the intensity of the fluorescence emitted by the second organic light emitting layer 400; moreover, this embodiment can further balance the amount of the triplet excitons transported to the first organic light emitting layer 200 and the amount of the singlet excitons transported to the second organic light emitting layer 400, thereby balancing the intensity of the phosphorescence emitted by the first organic light emitting layer 200 and the intensity of the fluorescence emitted by the second organic light emitting layer 400. In particular, when the organic electroluminescent device is a white light device, this embodiment can balance the proportion of light of different colors in the emitted light, thereby achieving a better white light balance.

It should be understood that in some cases, as shown in FIG. 4, a small amount of holes can pass through the exciton control layer 300 and reach an interface between the exciton control layer 300 and the second organic light emitting layer 400, and it is difficult for the small amount of holes to enter the second organic light emitting layer 400 under the barrier of the electron transport type host material in the second organic light emitting layer 400, and then recombine with the electrons at the interface to form the excitons. Correspondingly, a small amount of electrons can pass through the exciton control layer 300 and reach an interface between the exciton control layer 300 and the first organic light emitting layer 200, and it is difficult for the small amount of electrons to enter the first organic light emitting layer 200 under the barrier of the hole transport type host material in the first organic light emitting layer 200 and then recombine with the holes at the interface to form the excitons. These excitons can also diffuse into the first organic light emitting layer 200 and the second organic light emitting layer 400, so that the first organic light emitting layer 200 and the second organic light emitting layer 400 emit light.

Figure 6:
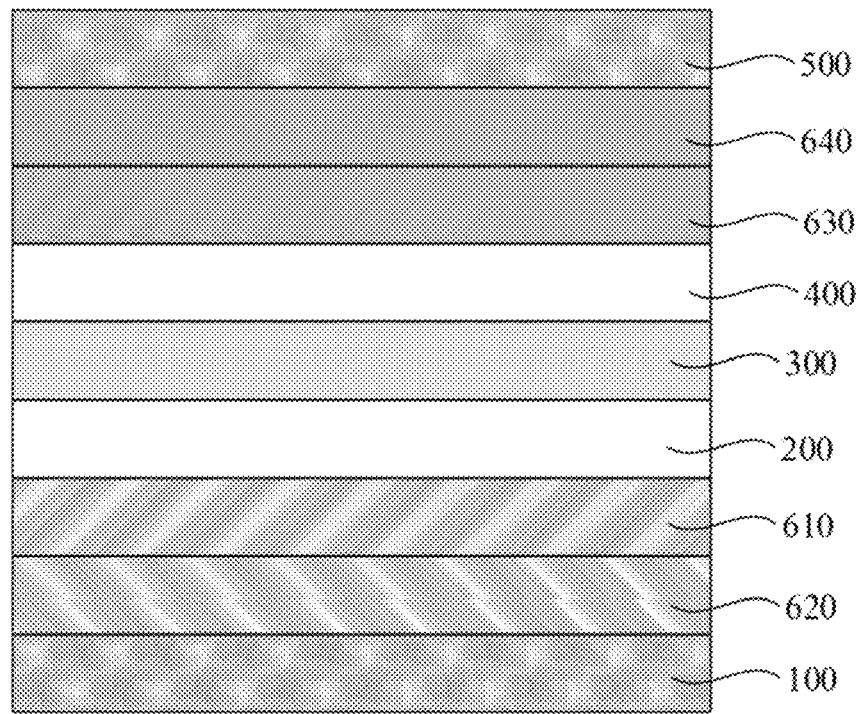
FIG. 6 is a schematic structural diagram of an organic electroluminescent device according to an embodiment of the present disclosure.

In some embodiments, as shown in FIG. 6, the organic electroluminescent device may further include a hole transport layer 610, and the hole transport layer 610 is disposed between the first organic light emitting layer 200 and the anode 100. The hole transport layer 610 is used to transport the holes from the anode 100 to the first organic light emitting layer 200, so as to improve the efficiency of the injection of the holes into the first organic light emitting layer 200 and the exciton control layer 300 and reduce a driving voltage of the organic electroluminescent device. The hole transport layer 610 may include one type of second hole transport material, or may include multiple different types of second hole transport materials, which is not particularly limited in the present disclosure.

In an embodiment of the present disclosure, the hole transport layer 610 may include the first hole transport material. In other words, when the hole transport layer 610 is composed of one type of second hole transport material, the second hole transport material and the first hole transport material may be the same hole transport material. When the hole transport layer 610 includes multiple types of second hole transport materials, one or more of the multiple types of second hole transport materials in the hole transport layer 610 may be used as the first hole transport material to be applied to the exciton control layer 300. This embodiment can facilitate the design and preparation of the organic electroluminescent device, and reduce the number of material types of the organic electroluminescent device to reduce the production cost of the organic electroluminescent device.

Further, as shown in FIG. 6, the organic electroluminescent device may further include a hole injection layer 620 in some embodiments, the hole injection layer 620 is disposed between the hole transport layer 610 and the anode 100, and is used to increase an ability of the anode 100 to inject the holes to the hole transport layer 610 and reduce the driving voltage of the organic electroluminescent device.

In some embodiments, as shown in FIG. 6, the organic electroluminescent device may further include an electron transport layer 630, and the electron transport layer 630 is disposed between the second organic light emitting layer 400 and the cathode 500. The electron transport layer 630 is used to transport the electrons from the cathode 500 to the second organic light emitting layer 400 to improve the efficiency of the injection of the electrons into the second organic light emitting layer 400 and the exciton control layer 300 and reduce the driving voltage of the organic electroluminescent device. The electron transport layer 630 may be composed of one type of second electron transport material, or may include multiple different types of second electron transport materials, which is not particularly limited in the present disclosure.

In an embodiment of the present disclosure, the electron transport layer 630 may include the first electron transport material. In other words, when the electron transport layer 630 is composed of one type of second electron transport material, the second electron transport material and the first electron transport material may be the same electron transport material. When the electron transport layer 630 includes the multiple different types of second electron transport materials, one or more of the multiple types of second electron transport materials in the electron transport layer 630 may be used as the first electron transport material to be applied to the exciton control layer 300. This embodiment can facilitate the design and preparation of the organic electroluminescent device, and reduce the number of material types of the organic electroluminescent device to reduce the production cost of the organic electroluminescent device.

Further, as shown in FIG. 6, the organic electroluminescent device may further include an electron injection layer 640 in some embodiments. The electron injection layer 640 is disposed between the electron transport layer 630 and the cathode 500, and is used to increase an ability of the cathode 500 to inject the electrons into the electron transport layer 630 and reduce the driving voltage of the organic electroluminescent device.

In some embodiments, the fluorescent doping material may be a blue fluorescent doping material. In this way, the organic light emitting layer 720 containing the fluorescent doping material can emit the blue light by using the diffused singlet excitons. Since the organic light emitting layer 720 containing the fluorescent doping material does not contain the phosphorescent doping material, the host material of the organic light emitting layer 720 containing the fluorescent doping material can be optimized to be compatible with the blue fluorescent doping material, and a variable range of a concentration of the blue fluorescent doping material in the organic light-emitting layer 720 containing the fluorescent doping material is wider, which are all conducive to the improvement of the internal quantum efficiency of the organic light emitting layer 720 containing the fluorescent doping material, thereby facilitating the improvement of the intensity of the blue light emitted by the organic electroluminescent device.

For example, in an embodiment of the present disclosure, the first dopant material in the first organic light emitting layer 200 is the blue fluorescent doping material, and an appropriate hole transport type host material can be selected according to the adaptation requirements of the blue fluorescent doping material, avoiding that the host material needs to combine the requirements of the blue fluorescent doping material and the phosphorescent doping material to lead to failing to meet an optimal selection of the blue fluorescent doping material, which helps to improve the matching degree of the hole transport type host material and the blue fluorescent doping material to improve the brightness of the blue light emitted by the first organic light emitting layer 200. Not only that, since the first organic light emitting layer 200 does not contain the phosphorescent doping material, an available range of the concentration of the blue fluorescent doping material is wider. Compared with a scheme containing the phosphorescent doping material and the blue fluorescent doping material, this scheme is less prone to fluorescence quenching, which also helps to further improve the light emitting brightness of the first organic light emitting layer 200 by optimizing the concentration of the blue fluorescent doping material.

For another example, in an embodiment of the present disclosure, the second doping material in the second organic light emitting layer 400 is the blue fluorescent doping material, and an appropriate electron transport type host material can be selected according to the adaptation requirements of the blue fluorescent doping material, avoiding that the host material needs to combine the requirements of the blue fluorescent doping material and the phosphorescent doping material to lead to failing to meet an optimal selection of the blue fluorescent doping material, which helps to improve the matching degree of the electron transport type host material and the blue fluorescent doping material to improve the brightness of the blue light emitted by the second organic light emitting layer 400. Not only that, since the second organic light emitting layer 400 does not contain the phosphorescent doping material, an available range of the concentration of the blue fluorescent doping material is wider. Compared with a scheme containing the phosphorescent doping material and the blue fluorescent doping material, this scheme is less prone to fluorescence quenching, which also helps to further improve the light emitting brightness of the second organic light emitting layer 400 by optimizing the concentration of the blue fluorescent doping material.

Exemplarily, in an exemplary embodiment of the present disclosure, the second doping material is the fluorescent doping material, and the first hole transport material is 4,4',4"-tris(N-3-methylPhenyl-N-phenylamino) triphenylamine; the first electron transport material is tris[2,4,6-trimethyl-3-(3-pyridyl)phenyl]borane; and the mass proportion of the first hole transport material in the exciton control layer 300 is 5%.

In some embodiments, the phosphorescent doping material is a yellow phosphorescent doping material. In this way, the organic light emitting layer 710 containing the phosphorescent doping material can emit the yellow light by using the diffused triplet excitons. Since the organic light emitting layer 710 containing the phosphorescent doping material does not contain the fluorescent doping material, the host material of the organic light emitting layer can be optimized to match the yellow phosphorescent doping material, and an adjustment range of a concentration of the yellow phosphorescent doping material in the organic light emitting layer is wider, which are all conducive to the improvement of the internal quantum efficiency of the organic light emitting layer 710 containing the phosphorescent doping material, thereby facilitating the improvement of the intensity of the blue light emitted by the organic electroluminescent device; accordingly, this also helps to adjust the brightness of the yellow light in the light emitted by the organic electroluminescent device by changing the concentration of the phosphorescent doping material, so that the yellow light intensity and the fluorescence intensity are more balanced.

In some embodiments, the phosphorescent doping material is the yellow phosphorescent doping material, and the fluorescent doping material is the blue fluorescent doping material. In this way, the organic light emitting layer 710 containing the phosphorescent doping material can emit the yellow light, and the organic light emitting layer 720 containing the fluorescent doping material can emit the blue light. The light emitting intensity of the organic light emitting layer 720 containing the fluorescent doping material can be increased, and the light emitting intensity of the organic light emitting layer 710 containing the phosphorescent doping material can be adjusted, so that the blue light and the yellow light emitted by the organic electroluminescent device can be mixed into the white light.

In an embodiment of the present disclosure, the first doping material is the yellow phosphorescent doping material, and the second doping material is the blue fluorescent doping material. When the organic electroluminescent device is in operation, the triplet excitons generated by the exciton control layer 300 can diffuse to the first organic light emitting layer 200, so that the first organic light emitting layer 200 emits the yellow light; and the singlet excitons generated by the exciton control layer 300 may diffuse to the second organic light emitting layer 400, so that the second organic light emitting layer 400 emits the blue light. An intensity of the yellow light and an intensity of the blue light can be balanced with each other, and then these two colors are mixed into the white-balanced white light.

In some embodiments, compositions of the second organic light emitting layer 400 can be optimized, so that the second organic light emitting layer 400 has the high light emitting brightness, thereby increasing the blue light intensity of the organic electroluminescent device. Compositions of the first organic light emitting layer 200 is optimized, so that the intensity of the yellow light emitted by the first organic light emitting layer 200 matches the intensity of the blue light emitted by the second organic light emitting layer 400 to achieve the white balance, so that the organic electroluminescent device emits the white light. In this way, the organic electroluminescent device can emit the white light with the high brightness and reduce a color shift of the emitted white light.

In another embodiment of the present disclosure, the second doping material is the yellow phosphorescent doping material, and the first doping material is the blue fluorescent doping material. When the organic electroluminescent device is in operation, the triplet excitons generated by the exciton control layer 300 can diffuse to the second organic light emitting layer 400, so that the second organic light emitting layer 400 emits the yellow light; and the singlet excitons generated by the exciton control layer 300 may diffuse to the first organic light emitting layer 200, so that the first organic light emitting layer 200 emits the blue light. An intensity of the yellow light and an intensity of the blue light can be balanced with each other, and then these two colors are mixed into the white-balanced white light.

In some embodiments, compositions of the first organic light emitting layer 200 can be optimized, so that the first organic light emitting layer 200 has the high light emitting brightness, thereby increasing the blue light intensity of the organic electroluminescent device. Compositions of the second organic light emitting layer 400 is optimized, so that the intensity of the yellow light emitted by the second organic light emitting layer 400 matches the intensity of the blue light emitted by the first organic light emitting layer 200 to achieve the white balance, so that the organic electroluminescent device emits the white light. In this way, the organic electroluminescent device can emit the white light with the high brightness and reduce a color shift of the emitted white light.

In some embodiments, the phosphorescent doping material includes a red phosphorescent doping material and a green phosphorescent doping material that are mixed with each other. In this way, the organic light emitting layer 710 containing the phosphorescent doping material can simultaneously emit red and green light by using the diffused triplet excitons. Since the organic light emitting layer 710 containing the phosphorescent doping material does not contain the fluorescent doping material, the host material of the organic light emitting layer can be optimized to match the red phosphorescent doping material and the green phosphorescent doping material, which are all conducive to the improvement of the internal quantum efficiency of the organic light emitting layer 710 containing the phosphorescent doping material, thereby facilitating the improvement of the intensity of the red and green light emitted by the organic electroluminescent device; accordingly, this also helps to adjust the brightness of the red and green light in the light emitted by the organic electroluminescent device by changing the concentrations of the red phosphorescent doping material and the green phosphorescent doping material, so that the red and green light intensity and the fluorescence intensity are more balanced.

In some embodiments, the phosphorescent doping material includes the red phosphorescent doping material and the green phosphorescent doping material that are mixed with each other, and the fluorescent doping material is the blue fluorescent doping material. In this way, the organic light emitting layer 710 containing the phosphorescent doping material can emit the red light and the green light, and the organic light emitting layer 720 containing the fluorescent doping material can emit the blue light. By increasing the light emitting intensity of the organic light emitting layer 720 containing the fluorescent doping material, the intensity of the blue light in the emitted light of the organic electroluminescent device can be increased. By adjusting a doping concentration of the red phosphorescent doping material and a doping concentration of the green phosphorescent doping material in the organic light emitting layer 710 containing the phosphorescent doping material, the red light intensity and the green light intensity in the emitted light of the organic electroluminescent device is adjusted, so that the blue, red and green light emitted by the organic electroluminescent device can be mixed into the white light, and the light emitting brightness of the organic electroluminescent device is improved.

In an embodiment of the present disclosure, the first doping material is the red phosphorescent doping material and the green phosphorescent doping material that are mixed with each other, and the second doping material is the blue fluorescent doping material. When the organic electroluminescent device is in operation, the triplet excitons generated by the exciton control layer 300 can diffuse to the first organic light emitting layer 200, so that the first organic light emitting layer 200 emits the red and green light; and the singlet excitons generated by the exciton control layer 300 may diffuse to the second organic light emitting layer 400, so that the second organic light emitting layer 400 emits the blue light. The intensity of the red light, the intensity of the green light and the intensity of the blue light can be balanced with each other, and then these three colors are mixed into the white-balanced white light.

In some embodiments, compositions of the second organic light emitting layer 400 can be optimized, so that the second organic light emitting layer 400 has the high light emitting brightness, thereby increasing the blue light intensity of the organic electroluminescent device. Compositions of the first organic light emitting layer 200 is optimized, so that the red light intensity and the green light intensity emitted by the first organic light emitting layer 200 matches the intensity of the blue light emitted by the second organic light emitting layer 400 to achieve the white balance, so that the organic electroluminescent device emits the white light. In this way, the organic electroluminescent device can emit the white light with the high brightness and reduce a color shift of the emitted white light.

In another embodiment of the present disclosure, the second doping material is the red phosphorescent doping material and the green phosphorescent doping material that are mixed with each other, and the first doping material is the blue fluorescent doping material. When the organic electroluminescent device is in operation, the triplet excitons generated by the exciton control layer 300 can diffuse to the second organic light emitting layer 400, so that the second organic light emitting layer 400 emits the red and green light; and the singlet excitons generated by the exciton control layer 300 may diffuse to the first organic light emitting layer 200, so that the first organic light emitting layer 200 emits the blue light. The intensity of the red light, the intensity of the green light and the intensity of the blue light can be balanced with each other, and then these three colors are mixed into the white-balanced white light. In some embodiments, compositions of the first organic light emitting layer 200 can be optimized, so that the first organic light emitting layer 200 has the high light emitting brightness, thereby increasing the blue light intensity of the organic electroluminescent device. Compositions of the second organic light emitting layer 400 is optimized, so that the intensity of the red light and the intensity of the green light emitted by the second organic light emitting layer 400 matches the intensity of the blue light emitted by the first organic light emitting layer 200 to achieve the white balance, so that the organic electroluminescent device emits the white light. In this way, the organic electroluminescent device can emit the white light with the high brightness and reduce a color shift of the emitted white light.

Figure 7:
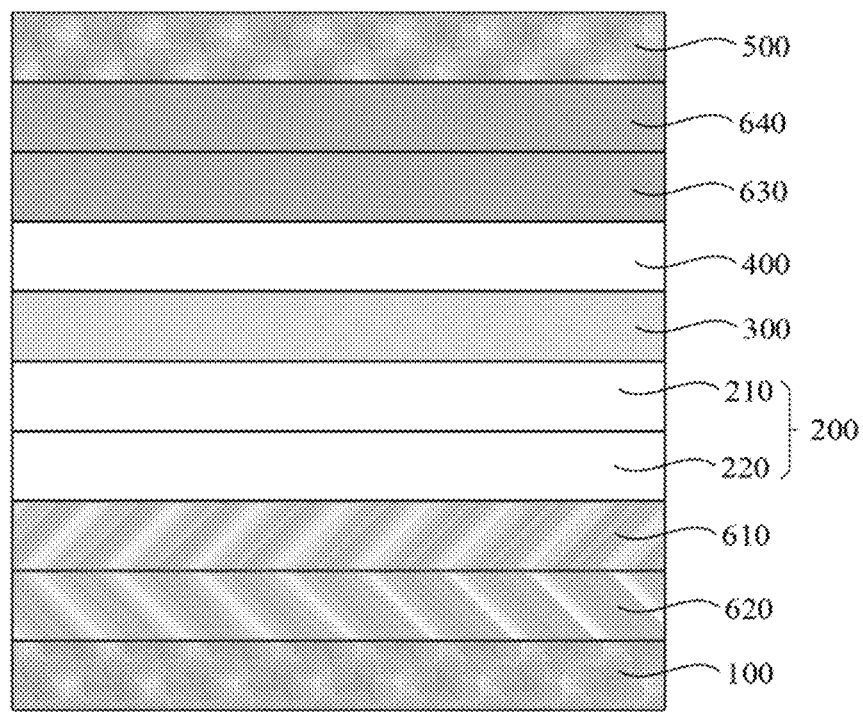
FIG. 7 is a schematic structural diagram of an organic electroluminescent device according to an embodiment of the present disclosure.

In some embodiments, the first doping material includes the red phosphorescent doping material and the green phosphorescent doping material, and the hole transport type host material includes a first hole transport type host material and a second hole transport type host material. As shown in FIG. 7, the first organic light emitting layer 200 includes a first green organic light emitting layer 210 and a first red organic light emitting layer 220 that are stacked; the first green organic light emitting layer 210 includes the first hole transport type host material and the green phosphorescent doping material, and the first red organic light emitting layer 220 includes the second hole transport type host material and the red phosphorescent doping material. The first hole transport type host material and the second hole transport type host material may be the same or different.

In this way, the first organic light emitting layer 200 includes the first green organic light emitting layer 210 and the first red organic light emitting layer 220 that are stacked, which facilitates the optimization of the first green organic light emitting layer 210 and the first red organic light emitting layer 220, respectively, improves the light emitting efficiency of the first green organic light emitting layer 210 and the light emitting efficiency of the first red organic light emitting layer 220 help to reduce the thickness of the first organic light emitting layer 200, and helps to reduce the thickness of the first organic light emitting layer 200. It is also convenient to independently and accurately control the light emitting intensity of the first green organic light emitting layer 210 and the light emitting intensity of the first red organic light emitting layer 220 and more helpful for the organic electroluminescent device to achieve the white balance.

In some embodiments, the first green organic light emitting layer 210 is disposed on a surface of the exciton control layer 300 away from the second organic light emitting layer 400; the first red organic light emitting layer 220 is disposed on a surface of the first green organic light emitting layer 210 away from the second organic light emitting layer 400. In this way, the light emitting intensity of the first green organic light emitting layer 210 can be ensured, which helps to balance the intensity of the red light and the intensity of the green light.

Figure 8:
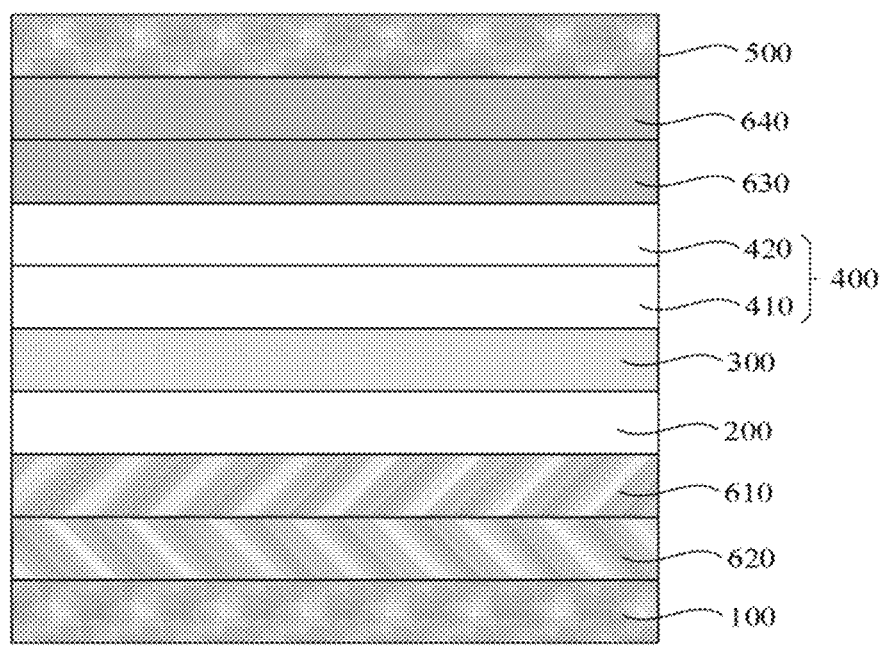
FIG. 8 is a schematic structural diagram of an organic electroluminescent device according to an embodiment of the present disclosure.

In some embodiments, the second doping material includes the red phosphorescent doping material and the green phosphorescent doping material, and the electron transport type host material includes a first electron transport type host material and a second electron transport type host material. As shown in FIG. 8, the second organic light emitting layer 400 includes a second green organic light emitting layer 410 and a second red organic light emitting layer 420 that are stacked; the second green organic light emitting layer 410 includes the first electron transport type host material and the green phosphorescent doping material, and the second red organic light emitting layer 420 includes the second electron transport type host material and the red phosphorescent doping material.

In this way, the second organic light emitting layer 400 includes the second green organic light emitting layer 410 and the second red organic light emitting layer 420 that are stacked, which facilitates the optimization of the second green organic light emitting layer 410 and the second red organic light emitting layer 420, respectively, improves the light emitting efficiency of the second green organic light emitting layer 410 and the light emitting efficiency of the second red organic light emitting layer 420 and helps to reduce the thickness of the second organic light emitting layer 400. It is also convenient to independently and accurately control the light emitting intensity of the second green organic light emitting layer 410 and the light emitting intensity of the second red organic light emitting layer 420 and more helpful for the organic electroluminescent device to achieve the white balance.

In some embodiments, the second green organic light emitting layer 410 is disposed on a surface of the exciton control layer 300 away from the first organic light emitting layer 200, and the second red organic light emitting layer 420 is disposed on a surface of the second green organic light emitting layer 410 away from the first organic light emitting layer 200. In this way, the light emitting intensity of the second green organic light emitting layer 410 can be guaranteed, which helps to balance the intensity of the red light and the intensity of the green light.

Hereinafter, an organic electroluminescent device is exemplarily provided to further explain and describe the structure and effects of the organic electroluminescent device of the present disclosure. As shown in FIG. 7, the exemplary organic electroluminescent device includes the anode 100, the hole injection layer 620, the hole transport layer 610, the first red organic light emitting layer 220, the first green organic light emitting layer 210, the exciton control layer 300, the second organic light emitting layer 400, the electron transport layer 630, the electron injection layer 640 and the cathode 500 that are stacked in sequence.

A material of the anode 100 is indium zinc oxide (ITO). A material of the hole injection layer 620 is poly(3,4-ethylenedioxythiophene)-poly(styrenesulfonate) (PEDOT:PSS) with a thickness of 30 nanometers. A material of the hole transport layer 610 is m-MTDATA with a thickness of 30 nanometers, where m-MTDATA represents 4,4',4"-tris(N-3-methylphenyl-N-phenylamino)triphenylamine. A material of the first red organic light emitting layer 220 is m-MTDATA doped with 5% by weight of PQIr, and the thickness is 5 nanometers, where m-MTDATA is the second hole transport type host material of the first red organic light emitting layer, and PQIr is the red phosphorescent doping material; PQIr represents tris(1-phenylquinoline)iridium. A material of the first green organic light emitting layer 210 is CBP doped with 10% by weight of Ir(ppy)3, and the thickness is 10 nm; wherein, CBP is the first hole transport type host material of the first green organic light emitting layer 210, Ir(ppy)$_3$ is the green phosphorescent doping material; CBP represents 4,4'-bis(9-carbazole)biphenyl, and Ir(ppy)$_3$ represents tris(2-phenylpyridine)iridium. A material of the exciton control layer 300 is m-MTDATA doped with 5% by weight of 3TPYMB, and the thickness is 10 nanometers, where m-MTDATA is the first hole transport material of the exciton control layer 300, and 3TPYMB is the first electron transport material of the exciton control layer 300; and 3TPYMB represents tris[2,4,6-trimethyl-3-(3-pyridyl)phenyl]borane. A material of the second organic light emitting layer 400 is MADN doped with 5% by weight of BCzVBi, and the thickness is 20 nanometers, where MADN is the electron transport type host material of the second organic light emitting layer 400, and BCzVBi is the blue fluorescent doping material; BCzVBi represents 4,4'-bis(9-ethyl-3-carbazole vinyl)-1,1'-biphenyl, MADN represents 3-tert-butyl-9,10-bis(2-naphthalene) anthracene. A material of the electron transport layer 630 is 3TPYMB with a thickness of 35 nm. A material of the electron injection layer 640 is LiF with a thickness of 1 nanometer. A material of the cathode 500 is Al with a thickness of 100 nm.

Briefly, the exemplary organic electroluminescent device can be expressed as:

ITO/PEDOT:PSS (30 nm)/m-MTDATA (30 nm)/m-MTDATA: PQIr (5 nm, 5%)/CBP:Ir(ppy)$_3$ (10 nm, 10%)/m-MTDATA:5% 3TPYMB (10 nm)/MADN:BCzVBi (20 nm, 5%)/3TPYMB (35 nm)/LiF (1 nm)/Al (100 nm).

In this exemplary organic electroluminescent device, a material of the exciton control layer 300 is m-MTDATA doped with 5% by weight of 3TPYMB, where a hole mobility of m-MTDATA is $2*10^{-4}$ cm$^2$V$^{-1}$s$^{-1}$, and an electron mobility of 3TPYMB is $1*10^{-5}$ cm$^2$V$^{-1}$s$^{-1}$. Since the content of 3TPYMB is less than that of m-MTDATA, in conjunction with their carrier mobility, it can be known that the center of the electron-hole recombination positions is close to the second organic light emitting layer, thereby ensuring that the generated singlet excitons can effectively diffuse to the second organic light emitting layer to ensure the intensity of blue light emitted by the organic electroluminescent device.

The exemplary organic electroluminescent device is prepared by the following method:

forming an ITO patterned electrodes by having a transparent glass substrate with ITO (area resistance<30Ω/□) to be subjected to photolithography, and then cleaning the ITO glass substrate in an ultrasonic environment of deionized water, acetone, and absolute ethanol in sequence, finally, drying the ITO glass substrate with N$_2$ and performing O$_2$ plasma treatment. Each film layer above ITO is formed by a vapor deposition process, and a vacuum degree is $3\times10^{-6}$ Torr during the vapor deposition. Except for an Al layer, each film layer is vapor deposited with an open mask and a deposition speed is 1 Å/s; the Al layer is vapor deposited with a metal mask, and the deposition rate is 3 Å/s. In this way, an organic electroluminescent device with a light emitting area of 2 mm×2 mm is prepared. After the organic electroluminescent device is prepared, the organic electroluminescent device is covered with a glass cover, and ultraviolet curing glue is coated around the organic electroluminescent device, and then the organic electroluminescent device is irradiated with a 265 nm ultraviolet lamp for 20-25 minutes to complete the encapsulation of organic electroluminescent devices.

Figure 9:
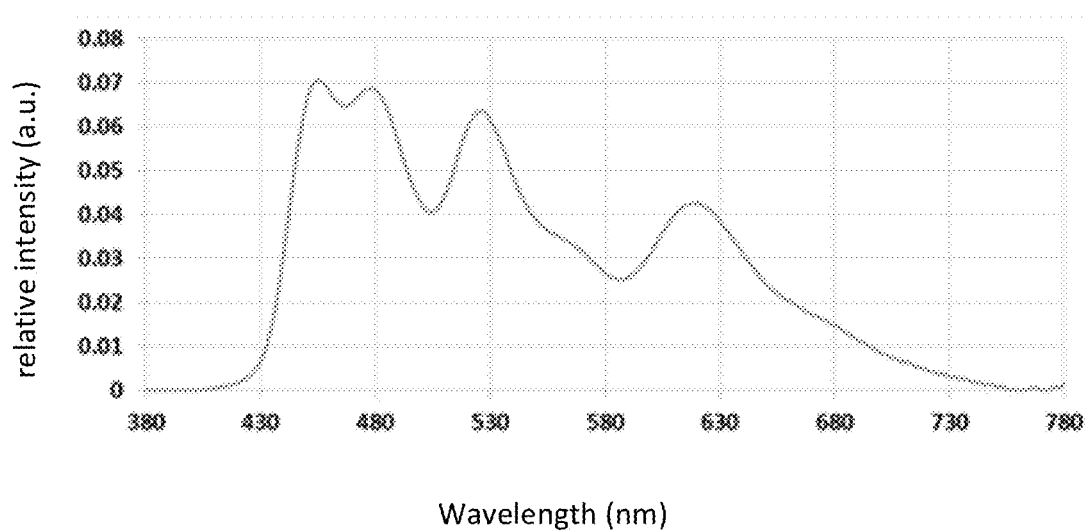
FIG. 9 is an emission spectrum diagram of an exemplary organic electroluminescent device according to an embodiment of the present disclosure.

The exemplary organic electroluminescent device is tested for performance at a current density of 10 mA/cm$^2$, and a spectrum of the emitted light of the organic electroluminescent device is collected, as shown in FIG. 9. It can be seen from FIG. 9 that the organic electroluminescent device emits the red, green, and blue light at the same time, and a proportion of the blue light is very high, which overcomes the defect of low blue light brightness in the hybrid 1-stack WOLED. Color coordinates of the exemplary organic electroluminescent device are (0.29, 0.35) with a good white light balance; the maximum current efficiency can reach 17.3 cd/A, which has high light emitting efficiency and overcomes the defect that the overall brightness of the fluorescent single-stacked WOLED is not high.

The embodiments of the present disclosure also provide an array substrate, which is any of the array substrates including the organic electroluminescent device described in the foregoing embodiments. The array substrate may be a flexible array substrate, a silicon-based array substrate, a glass-based array substrate, or other types of array substrates. Since the array substrate has any one of the organic electroluminescent devices described in the above-mentioned organic electroluminescent device embodiments, it has the same beneficial effects, and detailed description will not be repeated here.

It should be understood that the present disclosure is not limited to the detailed structure and arrangement of the components proposed by the present specification. The present disclosure is capable of having other embodiments, and be carried out and implemented in various manners. The foregoing variations and modifications fall within the scope of the present disclosure. It should be understood that the present disclosure disclosed and defined by the present specification extends to all alternative combinations of two or more of the individual features apparent or recited herein and/or in the drawings. All of these various combinations constitute a number of alternative aspects of the present disclosure. The embodiments described in the present specification are illustrative of the best mode for carrying out the invention and will enable those skilled in the art to utilize the present disclosure.

What is claimed is:

1. An organic electroluminescent device, comprising:
an anode, a first organic light emitting layer, an exciton control layer, a second organic light emitting layer, and a cathode that are successively stacked, wherein:
the first organic light emitting layer comprises a hole transport type host material and a first doping material;
the exciton control layer is disposed on a surface of the first organic light emitting layer, and comprises a first hole transport material and a first electron transport material; the second organic light emitting layer is disposed on a surface of the exciton control layer, and comprises an electron transport type host material and a second doping material;
the first doping material is a fluorescent doping material, the second doping material is a phosphorescent doping material, the first hole transport material in the exciton control layer is less than the first electron transport material in the exciton control layer, and a migration rate of holes in the exciton control layer is less than a migration rate of electrons in the exciton control layer; or the second doping material is the fluorescent doping material, the first doping material is the phosphorescent doping material, the first hole transport material in the exciton control layer is more than the first electron transport material in the exciton control layer, and a migration rate of holes in the exciton control layer is greater than a migration rate of electrons in the exciton control layer.

2. The organic electroluminescent device according to claim 1, wherein the exciton control layer is composed of the first hole transport material and the first electron transport material.

3. The organic electroluminescent device according to claim 1, wherein a thickness of the exciton control layer is 2-20 nm.

4. The organic electroluminescent device according to claim 1, wherein the organic electroluminescent device further comprises: a hole transport layer, disposed between the first organic light emitting layer and the anode; wherein the hole transport layer comprises the first hole transport material.

5. The organic electroluminescent device according to claim 1, wherein the organic electroluminescent device further comprises: an electron transport layer, disposed between the second organic light emitting layer and the cathode; wherein the electron transport layer comprises the first electron transport material.

6. The organic electroluminescent device according to claim 1, wherein:
the first doping material is the fluorescent doping material, and a mass proportion of the first hole transport material in the exciton control layer is 0.1%-50%; or,
the second doping material is the fluorescent doping material, and a mass proportion of the first electron transport material in the exciton control layer is 0.1%-50%.

7. The organic electroluminescent device according to claim 1, wherein:
the first doping material is the fluorescent doping material, and a mass proportion of the first hole transport material in the exciton control layer is 0.3%-10%; or,
the second doping material is the fluorescent doping material, and a mass proportion of the first electron transport material in the exciton control layer is 0.3%-10%.

8. The organic electroluminescent device according to claim 1, wherein the second doping material is the fluorescent doping material, and the first hole transport material is 4,4',4"-tris(N-3-methylPhenyl-N-phenylamino) triphenylamine; the first electron transport material is tris[2,4,6-trimethyl-3-(3-pyridyl)phenyl]borane; and a mass proportion of the first hole transport material in the exciton control layer is 5%.

9. The organic electroluminescent device according to claim 1, wherein the phosphorescent doping material is a yellow phosphorescent doping material.

10. The organic electroluminescent device according to claim 1, wherein the phosphorescent doping material comprises a red phosphorescent doping material and a green phosphorescent doping material mixed with each other.

11. The organic electroluminescent device according to claim 1, wherein
the first doping material comprises a red phosphorescent doping material and a green phosphorescent doping material, and the hole transport type host material comprises a first hole transport type host material and a second hole transport type host material; and the first organic light emitting layer comprises a first green organic light emitting layer and a first red organic light emitting layer that are stacked; the first green organic light emitting layer comprises the first hole transport type host material and the green phosphorescent doping material, and the first red organic light emitting layer comprises the second hole transport type host material and the red phosphorescent doping material.

12. The organic electroluminescent device according to claim 11, wherein the first green organic light emitting layer is disposed on a surface of the exciton control layer away from the second organic light emitting layer; the first red organic light emitting layer is disposed on a surface of the first green organic light emitting layer away from the second organic light emitting layer.

13. The organic electroluminescent device according to claim 1 wherein
the second doping material comprises a red phosphorescent doping material and a green phosphorescent doping material, and the electron transport type host material comprises a first electron transport type host material and a second electron transport type main material; and
the second organic light emitting layer comprises a second green organic light emitting layer and a second red organic light emitting layer that are stacked; the second green organic light emitting layer comprises the first electron transport type host material and the green phosphorescent doping material, and the second red organic light emitting layer comprises the second electron transport type host material and the red phosphorescent doping material.

14. The organic electroluminescent device according to claim 13, wherein the second green organic light emitting layer is disposed on a surface of the exciton control layer away from the first organic light emitting layer, and the second red organic light emitting layer is disposed on a surface of the second green organic light emitting layer away from the first organic light emitting layer.

15. An array substrate, comprising:
an organic electroluminescent device, comprising:
an anode, a first organic light emitting layer, an exciton control layer, a second organic light emitting layer, and a cathode that are successively stacked, wherein:
the first organic light emitting layer comprises a hole transport type host material and a first doping material;
the exciton control layer is disposed on a surface of the first organic light emitting layer, and comprises a first hole transport material and a first electron transport material; the second organic light emitting layer is disposed on a surface of the exciton control layer, and comprises an electron transport type host material and a second doping material;
the first doping material is a fluorescent doping material, the second doping material is a phosphorescent doping material, the first hole transport material in the exciton control layer is less than the first electron transport material in the exciton control layer, and a migration rate of holes in the exciton control layer is less than a migration rate of electrons in the exciton control layer; or
the second doping material is the fluorescent doping material, the first doping material is the phosphorescent doping material, the first hole transport material in the exciton control layer is more than the first electron transport material in the exciton control layer, and a migration rate of holes in the exciton control layer is greater than a migration rate of electrons in the exciton control layer.

16. The array substrate according to claim 15, wherein the exciton control layer is composed of the first hole transport material and the first electron transport material.

17. The array substrate according to claim 15, wherein a thickness of the exciton control layer is 2-20 nm.

18. The array substrate according to claim 15, wherein the organic electroluminescent device further comprises: a hole transport layer, disposed between the first organic light emitting layer and the anode; wherein the hole transport layer comprises the first hole transport material.

19. The array substrate according to claim 15, wherein the organic electroluminescent device further comprises: an electron transport layer, disposed between the second organic light emitting layer and the cathode; wherein the electron transport layer comprises the first electron transport material.

20. The array substrate according to claim 15, wherein:
the first doping material is the fluorescent doping material, and a mass proportion of the first hole transport material in the exciton control layer is 0.1%-50%; or,
the second doping material is the fluorescent doping material, and a mass proportion of the first electron transport material in the exciton control layer is 0.1%-50%.

* * * * *